United States Patent
Park

(10) Patent No.: US 8,772,936 B2
(45) Date of Patent: Jul. 8, 2014

(54) SEMICONDUCTOR DEVICE WITH A COPPER LINE AND METHOD FOR MANUFACTURING THE SAME

(75) Inventor: Hyung Jin Park, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 13/607,631

(22) Filed: Sep. 7, 2012

(65) Prior Publication Data
US 2013/0256891 A1    Oct. 3, 2013

(30) Foreign Application Priority Data
Mar. 27, 2012 (KR) .................. 10-2012-0031097

(51) Int. Cl.
| H01L 23/52 | (2006.01) |
| H01L 23/48 | (2006.01) |
| H01L 21/4763 | (2006.01) |
| H01L 21/44 | (2006.01) |
| H01L 21/768 | (2006.01) |

(52) U.S. Cl.
CPC ................. *H01L 21/76831* (2013.01)
USPC .......................... 257/751; 438/627; 438/653

(58) Field of Classification Search
CPC .................................. H01L 21/76831
USPC ................... 438/700–703, 627, 653; 257/751
See application file for complete search history.

(56) References Cited

U.S. PATENT DOCUMENTS

| 6,635,583 B2 * | 10/2003 | Bencher et al. ............... 438/761 |
| 2008/0246148 A1 * | 10/2008 | Won et al. ..................... 257/746 |
| 2009/0051033 A1 * | 2/2009 | Gosset et al. ................. 257/751 |

* cited by examiner

*Primary Examiner* — Luan C Thai

(57) ABSTRACT

A semiconductor device with a copper line comprises a lower portion of a copper pattern buried in an interlayer insulating film, an upper portion of the copper disposed over the upper portion of the lower copper pattern, and an upper barrier metal layer disposed over upper and side surfaces of the upper copper pattern. As a result, the copper pattern is protected by the barrier metal layers, providing a metal line with a stable structure.

15 Claims, 6 Drawing Sheets

SEMICONDUCTOR DEVICE WITH A COPPER LINE AND METHOD FOR MANUFACTURING THE SAME

CROSS-REFERENCE TO RELATED APPLICATION

The present application claims priority to Korean patent application No. 10-2012-0031097 filed on Mar. 27, 2012, which is incorporated by reference in its entirety.

BACKGROUND OF THE INVENTION

1. Technical Field

The present invention relates generally to a semiconductor device and a method for manufacturing the same, and more particularly to a semiconductor device including a metal line with a stable structure.

2. Related Art

In semiconductor devices, metal lines are formed in order to electrically couple devices or other conductive lines, and contact plugs are formed in order to connect lower metal lines to upper metal lines. However, the increasing degree of integration of semiconductor devices has led to a reduction in design rules. As the design rule decreases, the area available for contact holes is diminishing, so the aspect ratio of contact holes where the contact plug is formed is gradually increasing. As a result, the difficulty and importance of processes for forming the metal line and the contact plug have received an increased amount of attention.

For the metal line, aluminum (Al) and tungsten (W), each of which has excellent electric conductivity, have been widely used. Recent research has focused on using copper (Cu) as a next generation metal line material. Copper can overcome problems associated with resistor capacitor (RC) signal delay in a highly integrated high-speed operation device because copper has a relatively high electrical conductivity and low resistance. However, because it is not easy to perform a dry etching process on copper lines, a damascene process is used in order to form copper metal lines.

A method for forming a metal line with a damascene process may be performed according to the following steps. First, an interlayer insulating film is formed over a semiconductor substrate, and the interlayer insulating film is etched to form a trench. After a barrier metal layer is formed on the surface of the trench, a copper material is deposited in the trench over the barrier metal layer. Next, a chemical mechanical polishing (CMP) process is performed to form a separated copper pattern. A protective film is then formed over the pattern to prevent the upper portion of the copper pattern to physically stabilize the pattern.

In the above-described conventional semiconductor device and manufacturing method, it is difficult to form barrier metal layers over the copper pattern after separating each copper pattern by the CMP process. Although the upper portion of the copper pattern is protected by the protective film, the upper portion of the copper pattern is exposed to atmosphere during a subsequent process for forming a contact plug.

BRIEF SUMMARY OF THE INVENTION

Various embodiments of the present invention are directed to providing a semiconductor device including a metal line with a stable structure by protecting the whole surface of a copper pattern formed by a damascene method with barrier metal layers.

According to one aspect of an exemplary embodiment, a semiconductor device comprises: a copper pattern disposed over a substrate, the copper pattern including a lower copper pattern portion disposed below an upper surface of an interlayer insulating film, and an upper copper pattern portion disposed over the lower copper pattern portion and above the upper surface of the interlayer insulating film and an upper barrier metal layer disposed over a side surface and an upper surface of the copper pattern.

The semiconductor device further comprise a lower barrier metal layer disposed over the side surface and a lower surface of the copper pattern.

The semiconductor device further comprise a nitride film disposed over the upper barrier metal layer and the interlayer insulating film, and between adjacent upper copper pattern portions.

The semiconductor device further comprise a mask layer disposed over the upper barrier metal layer.

The mask layer includes an undoped-silicon-glass (USG) oxide film.

The lower barrier metal layer and the upper barrier metal layer include at least one material selected from the group consisting of tantalum (Ta), TaN (tantalum nitride), and tantalum silicon nitride (TaSiN).

The semiconductor device further comprises a contact plug disposed over the upper copper pattern and coupled to the upper barrier metal layer.

The upper barrier metal layer has a thickness that is greater than a thickness of the lower barrier metal layer.

The mask layer is agglomerated over a top surface and upper portions of sidewalls of the upper metal barrier layer.

According to another aspect of an exemplary embodiment, a method for manufacturing a semiconductor device comprises: filling a trench in an interlayer insulating film with a copper pattern; removing a portion of the interlayer insulating film to expose a portion of the copper pattern; forming an upper barrier metal layer over the exposed copper pattern and the interlayer insulating pattern; forming a mask layer over the upper barrier metal layer; and etching portions of the upper barrier metal layer disposed over the interlayer insulating film and between adjacent copper patterns using the mask layer as an etching mask.

The step of removing the part of the interlayer insulating film, all of a top surface and a portion of a side surface of the copper pattern are exposed.

The mask layer includes an undoped-silicon-glass (USG) oxide film.

The step of forming a mask layer further comprises: depositing the USG oxide film; and wet-etching the USG oxide film to remove portions of the USG oxide film disposed over the interlayer insulating film and between adjacent copper patterns.

The mask layer is agglomerated over a top surface and upper portions of sidewalls of the upper metal barrier layer.

The step of filling the trench further comprises: etching the interlayer insulating film to form the trench; depositing copper on a surface of the interlayer insulating film including surfaces of the trench; and planarizing an upper portion of the deposited copper so that the copper pattern remains in the trench.

The step of filling the trench further comprises forming a lower barrier metal layer over sidewalls and a lower surface of the trench.

The upper barrier metal layer and the lower barrier metal layer include at least one material selected from the group consisting of Ta, TaN, and TaSiN.

A thickness of the lower barrier metal layer is less than a thickness of the upper barrier metal layer.

The method further comprises forming a contact plug coupled to the upper barrier metal layer over the copper pattern.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DESCRIPTION OF EMBODIMENTS

Exemplary embodiments of the present invention will be described in detail with reference to the attached drawings.

Figure 1:
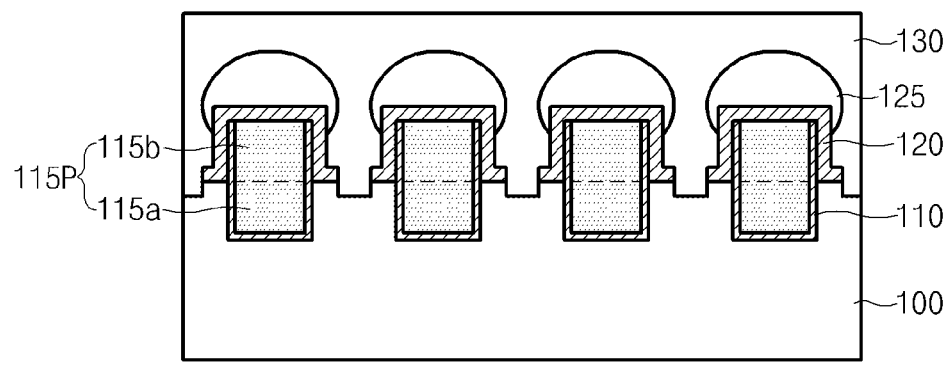
FIG. 1 illustrates a cross-sectional diagram of a semiconductor device according to an exemplary embodiment of the present invention.

The cross-sectional diagram in FIG. 1 illustrates a semiconductor device according to an exemplary embodiment of the present invention.

Referring to FIG. 1, an interlayer insulating film 100 is formed over a semiconductor substrate (not shown), and a recess is formed with a given depth in the interlayer insulating film 100. A lower copper pattern portion 115a is buried in the recess, and an upper copper pattern portion 115b is formed over the lower copper pattern portion 115a. In an embodiment, both of the lower copper pattern portion 115a and the upper copper pattern portion 115b have the same line-width, so that both of the portions combined constitute a single united copper pattern 115p. In an embodiment, both of the lower copper pattern portion 115a and the upper copper pattern portion 115b are formed in the same process to ensure uniformity of the interface between the portions.

A lower barrier metal layer 110 is disposed over side surfaces and the lower surface of the lower copper pattern portion 115a, and an upper barrier metal layer 120 is disposed over side surfaces and the upper surface of the upper copper pattern portion 115b. As a result, the upper, lower, and side surfaces of the copper pattern 115p are covered with barrier metal layers. In other words, a cross-section of the pattern 115p is completely enclosed by the lower barrier metal layer 110 and the upper barrier metal layer 120. The lower barrier metal layer 110 and the upper barrier metal layer 120 include at least one of tantalum (Ta), tantalum nitride (TaN) and tantalum silicon nitride (TaSiN).

The semiconductor device may further comprise a mask layer 125 over the upper barrier metal layer 120. The mask layer 125 may include an undoped silicon glass (USG) oxide film. As seen in FIG. 1, the mask layer 125 may be agglomerated over the top surface and upper portions of sidewalls of the upper barrier metal layer 120.

A protective film 130 is formed over the interlayer insulating film 100 and the upper barrier metal layer 120 where the mask layer 125 is formed. The protective film 130 may include a nitride film. The semiconductor device may further comprise a contact plug (not shown) coupled to the upper barrier metal layer 120.

As mentioned above, a profile of the copper pattern 115p is completely enclosed by the lower barrier metal layer 110 and the upper barrier metal layer 120. The barrier metal layers protect the whole copper pattern 115p, which improves electro migration (EM) and stress migration (SM) characteristics. Also, since a dual structure including the upper barrier metal layer 120 and the protective film 130 is formed over the copper pattern 115p, the probability of exposing the copper pattern 115p during a subsequent process of forming a contact plug is decreased. Furthermore, since the protective film 130 protects side surfaces of the copper pattern 115p as well as the upper surface of the copper pattern 115p, the likelihood of a metal bridge defect occurring between adjacent copper lines is decreased.

Cross-sectional diagrams in FIGS. 2a to 2i illustrate a method for manufacturing a semiconductor device according to an exemplary embodiment of the present invention.

Figure 2A:
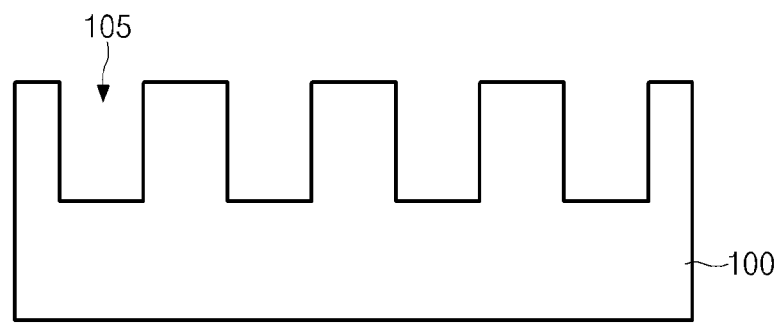
FIGS. 2a to 2i illustrate cross-sectional diagrams of a method for manufacturing a semiconductor device according to an exemplary embodiment of the present invention.

Referring to FIG. 2a, an interlayer insulating film 100 is formed over the semiconductor substrate (not shown). The interlayer insulating film 100 may include an oxide film. A mask pattern (not shown) is formed over the interlayer insulating film 100. The interlayer insulating film 100 is etched with the mask pattern (not shown) as an etching mask to form a recess 105.

Figure 2B:
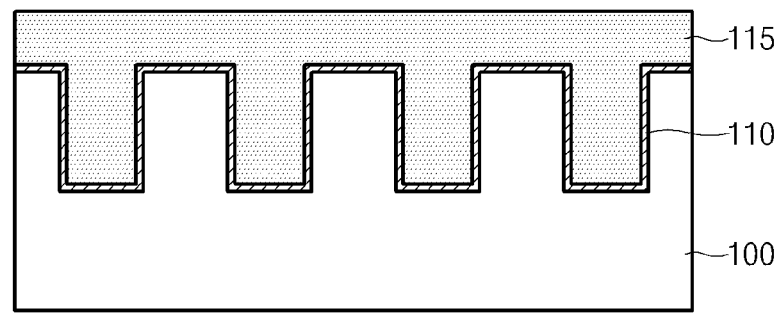

Referring to FIG. 2b, after the mask pattern (not shown) is removed, the lower barrier metal layer 110 is deposited on the surface of the interlayer insulating film 100, including the bottom and side surfaces of recess 105. The lower barrier metal layer 110 may include at least one of tantalum (Ta), tantalum nitride (TaN) and tantalum silicon nitride (TaSiN). A copper seed layer (not shown) is deposited over the interlayer insulating film 100, including the bottom and side surfaces of the recess 105 which are covered by the lower barrier metal layer 110. The copper seed layer (not shown) may be deposited by a physical vapor deposition (PVD) method, and include copper or a copper alloy. An electroplating method is then performed on the copper seed layer (not shown) to form copper layer 115. Electroplating over a seed layer has a benefit of minimizing the probability of voids when filling the recess 105.

Figure 2C:
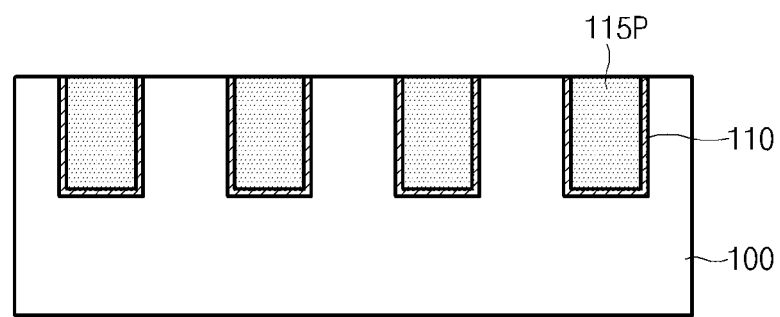

Referring to FIG. 2c, the copper layer 115 is etched until the interlayer insulating film 100 is exposed. The copper remaining in the recess 105 after etching is copper pattern 115p. The process of etching the copper layer 115 may be performed by a chemical mechanical polishing (CMP) method.

Figure 2D:
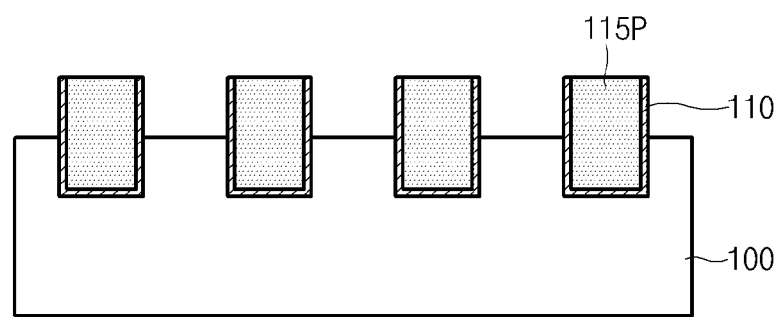

Referring to FIG. 2d, an upper portion in the interlayer insulating film 100 is etched to expose upper sidewalls of the copper pattern 115p, which are covered by lower barrier metal layer 110. The process of etching the interlayer insulating film 100 may include an etching gas or an etching solution having a slow etching speed in order to evenly remove upper portions of the interlayer insulation film 100, while minimizing the effect on copper pattern 115p and lower barrier metal layer 110.

Figure 2E:
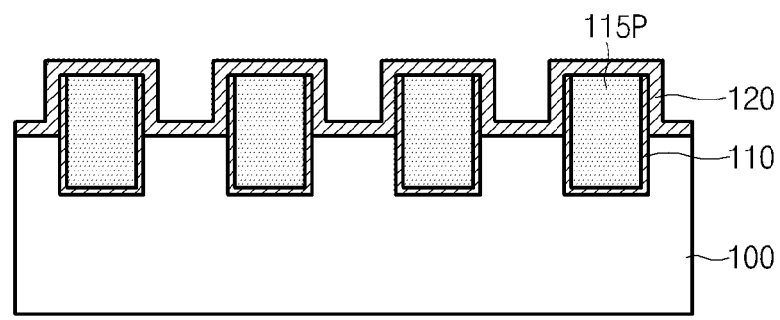

Referring to FIG. 2e, upper barrier metal layer 120 is formed over the interlayer insulating film 100 and the copper pattern 115p. In an embodiment, the upper barrier metal layer 120 is formed with the same material as the lower barrier metal layer 110. For example, the material of both of the lower barrier metal layer 110 and the upper barrier metal layer 120 may include at least one of Ta, TaN and TaSiN. The upper barrier metal layer 120 is formed to cap upper portions including the top surface of the copper pattern 115p, and its thickness may be determined in consideration of an etching target of a subsequent process and a pitch of the copper pattern 115p.

Figure 2F:
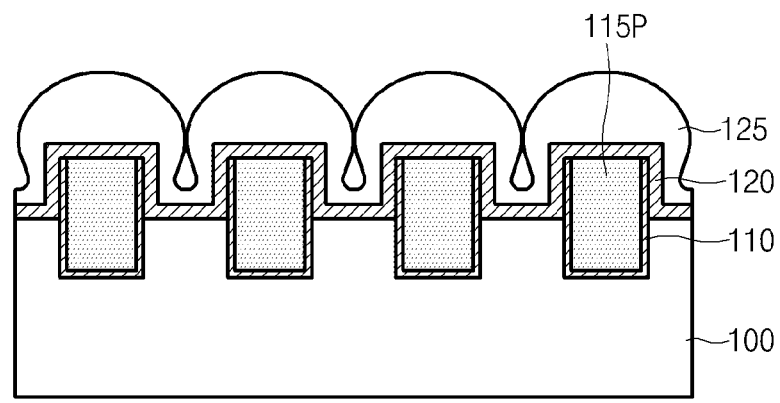

Referring to FIG. 2f, mask layer 125 is formed over the interlayer insulating film 100 and the copper pattern 115p. The mask layer 125 may include a material having a weak step coverage characteristic. For example, the mask layer 125 may include an undoped-silicon-glass (USG) oxide film. Because of the weak step coverage characteristic, the deposited mask layer 125 may be agglomerated over upper surfaces of upper barrier metal layer 120. The mask layer 125 protects the upper barrier metal layer 120 located over the copper pattern 115p.

Figure 2G:
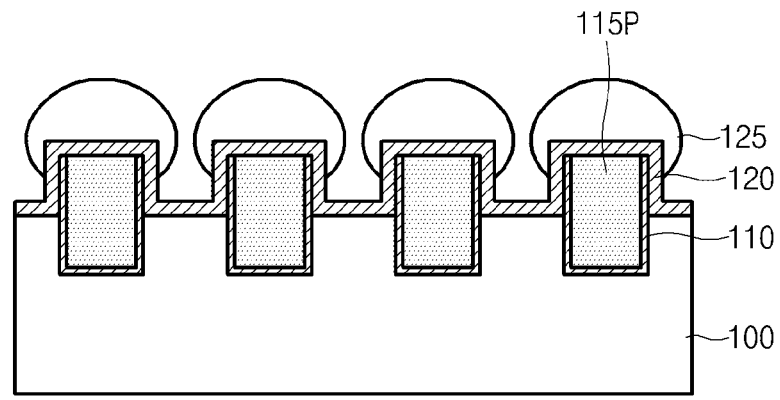

Referring to FIG. 2g, the mask layer 125 is etched to remove portions of the mask layer 125 that are disposed between adjacent copper patterns 115p, so that the mask layer can be used to etch the area between adjacent copper patterns in a subsequent process. After etching, the mask layer 125 may remain only over an upper portion of the copper pattern 115p. The process of etching the mask layer 125 may be performed by a wet etching method, and a target of the wet etching may be determined based on a part having a narrow pitch of the copper pattern 115p. The wet etch process may be performed with a wet etching solution including hydrofluoric acid (HF). As is apparent in FIG. 2g, mask layer 125 may retain its agglomerated shape after the wet etch process has been performed.

Figure 2H:
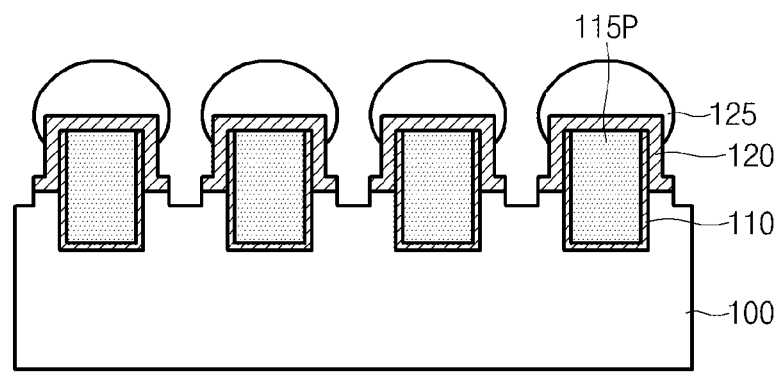

Referring to FIG. 2h, the upper barrier metal layer 120 located over the interlayer insulating film 100 is etched using the mask layer 125 as an etching mask so as to remove portions of the upper barrier metal layer 120 disposed between adjacent copper patterns 115p, thereby isolating portions of the barrier metal layers surrounding each of the copper patterns 115p. Through the processes of FIGS. 2a to 2h described above, the copper pattern 115p is enclosed by the lower barrier metal layer 110 and the upper barrier metal layer 120. In addition, as seen in FIG. 2h, a portion of the interlayer insulating film 100 disposed between adjacent copper patterns 115p may be etched when etching the upper barrier metal layer 120, thereby forming shallow trenches in the interlayer insulting film 100.

Figure 2I:
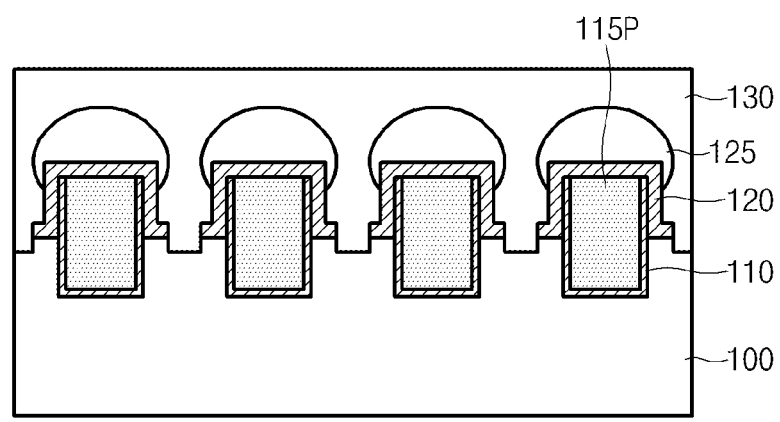

Referring to FIG. 2i, protective film 130 is formed over the copper pattern 115p. The resulting protective film 130 is disposed in spaces between adjacent copper patterns 115p, including filling shallow trenches in interlayer insulating film 100 that may have been formed when etching the upper barrier metal layer 120. The protective film 130 prevents physical movement of the copper pattern 115p. The protective film 130 may include a nitride film. That is, a structure including an oxide film, which is the interlayer insulating film 100, and a nitride film, which is the protective film 130, is formed between the copper patterns 115p. A contact plug (not shown) coupled to the upper barrier metal layer 120 may be subsequently formed over the copper pattern 115p.

According to the method described above, the copper pattern 115p in a resulting structure is enclosed by the lower barrier metal layer 110 and the upper barrier metal layer 120. The barrier metal layers protect the copper pattern 115p, thereby improving electro migration (EM) and stress migration (SM) characteristics. Also, since the dual structure including the upper barrier metal layer 120 and the protective film 130 is formed over the copper pattern 115p, the probability of exposing the copper pattern 115p during a subsequent process of forming the contact plug is reduced. Moreover, since the protective film 130 protects side surfaces of the copper pattern 115p as well as the upper surface of the copper pattern 115p, the probability of a metal bridge defect occurring between adjacent copper patterns 115p is decreased.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   A copper pattern disposed over a substrate, the copper pattern including a lower copper pattern portion disposed below an upper surface of an interlayer insulating film, and an upper copper pattern portion disposed over the lower copper pattern portion and above the upper surface of the interlayer insulating film;
   a lower barrier metal layer disposed over the side surface and a lower surface of the copper pattern;
   an upper barrier metal layer disposed over the lower barrier metal layer of the side surface of the upper copper pattern and an upper surface of the copper pattern; and
   a mask layer disposed over the upper barrier metal layer.

2. The semiconductor device according to claim 1, further comprising a nitride film disposed over the upper barrier metal layer and the interlayer insulating film, and between adjacent upper copper pattern portions.

3. The semiconductor device according to claim 1, wherein the mask layer includes an undoped-silicon-glass (USG) oxide film.

4. The semiconductor device according to claim 1, wherein the lower barrier metal layer and the upper barrier metal layer include at least one material selected from the group consisting of tantalum (Ta), TaN (tantalum nitride), and tantalum silicon nitride (TaSiN).

5. The semiconductor device according to claim 1, wherein the upper barrier metal layer has a thickness that is greater than a thickness of the lower barrier metal layer.

6. The semiconductor device according to claim 1, wherein the mask layer is agglomerated over a top surface and upper portions of sidewalls of the upper metal barrier layer.

7. A method for manufacturing a semiconductor device, the method comprising:
   filling a trench in an interlayer insulating film with a copper pattern;
   removing a portion of the interlayer insulating film to expose a portion of the copper pattern;
   forming an upper barrier metal layer over the exposed copper pattern and the interlayer insulating pattern;
   forming a mask layer over the upper barrier metal layer; and
   etching portions of the upper barrier metal layer disposed over the interlayer insulating film and between adjacent copper patterns using the mask layer as an etching mask.

8. The method according to claim 7, wherein, in the step of removing the part of the interlayer insulating film, all of a top surface and a portion of a side surface of the copper pattern are exposed.

9. The method according to claim 7, wherein the mask layer includes an undoped-silicon-glass (USG) oxide film.

10. The method according to claim 9, wherein the step of forming a mask layer further comprises:
    depositing the USG oxide film; and
    wet-etching the USG oxide film to remove portions of the USG oxide film disposed over the interlayer insulating film and between adjacent copper patterns.

11. The method according to claim 10, wherein the mask layer is agglomerated over a top surface and upper portions of sidewalls of the upper metal barrier layer.

12. The method according to claim 7, wherein the step of filling the trench further comprises:
   etching the interlayer insulating film to form the trench;
   depositing copper on a surface of the interlayer insulating film including surfaces of the trench; and
   planarizing an upper portion of the deposited copper so that the copper pattern remains in the trench.

13. The method according to claim 7, wherein the step of filling the trench further comprises forming a lower barrier metal layer over sidewalls and a lower surface of the trench.

14. The method according to claim 13, wherein the upper barrier metal layer and the lower barrier metal layer include at least one material selected from the group consisting of Ta, TaN, and TaSiN.

15. The method according to claim 13, wherein a thickness of the lower barrier metal layer is less than a thickness of the upper barrier metal layer.

* * * * *